US006943994B2

(12) United States Patent
Zheng et al.

(10) Patent No.: US 6,943,994 B2
(45) Date of Patent: Sep. 13, 2005

(54) DESIGN OF CANTED SYNTHETIC PATTERN EXCHANGE SPIN VALVE HEAD FOR IMPROVING STABILITY AND BIAS

(75) Inventors: Youfeng Zheng, San Jose, CA (US); Kochan Ju, Monte Sereno, CA (US); Min Li, Fremont, CA (US); Ben Hu, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 178 days.

(21) Appl. No.: 10/365,983

(22) Filed: Feb. 13, 2003

(65) Prior Publication Data

US 2004/0160708 A1 Aug. 19, 2004

(51) Int. Cl.[7] .................................. G11B 5/127
(52) U.S. Cl. .................................. 360/324.12; 29/603.14
(58) Field of Search .................................. 360/324.12, 324.1; 29/603.14, 603.15; 448/108

(56) References Cited

U.S. PATENT DOCUMENTS

| | | | | |
|---|---|---|---|---|
| 5,701,222 A | | 12/1997 | Gill et al. | |
| 6,201,673 B1 | * | 3/2001 | Rottmayer et al. | 360/324.12 |
| 6,230,390 B1 | | 5/2001 | Guo et al. | 29/603.14 |
| 6,295,718 B1 | | 10/2001 | Li et al. | 29/603.08 |
| 6,308,400 B1 | | 10/2001 | Liao et al. | 29/603.14 |
| 6,322,640 B1 | * | 11/2001 | Xiao et al. | 148/308 |
| 6,614,630 B2 | * | 9/2003 | Horng et al. | 360/324.12 |
| 6,729,014 B2 | * | 5/2004 | Lin et al. | 29/603.14 |
| 2003/0156361 A1 | * | 8/2003 | Li et al. | 360/324.12 |
| 2003/0179517 A1 | * | 9/2003 | Horng et al. | 360/324.12 |
| 2004/0042131 A1 | * | 3/2004 | Dobisz et al. | 360/324.12 |

OTHER PUBLICATIONS

HT–01–036/038, U.S. Appl. No. 10/104,802, filed Mar. 22, 2002, assigned to the same assignee, "Transverse or Longitudinal Patterned Synthetic Exchange Biasing for Stabilizing GMR Sensors".

HT–01–032, U.S. Appl. No. 10/091,959, filed Mar. 6, 2002, assigned to the same assignee, "Easily Manufactured Exchange Bias Stabilization Scheme".

HT–01–037, U.S. Appl. No. 10/077,064, filed Feb. 15, 2002, assigned to the same assignee, "Synthetic Pattern Exchange Configuration for Side Reading Reduction".

* cited by examiner

*Primary Examiner*—Allen Cao
(74) *Attorney, Agent, or Firm*—George D. Saile; Stephen B. Ackerman

(57) ABSTRACT

A GMR sensor comprising a sensor element having a spin valve configuration with a synthetic antiferromagnetic pinned layer and further comprising a ferromagnetic free layer biased by synthetic exchange biasing in a direction canted relative to the air bearing surface plane of the sensor. The resulting GMR sensor has a stable free layer domain structure, stable bias point and a wide dynamic range.

15 Claims, 5 Drawing Sheets

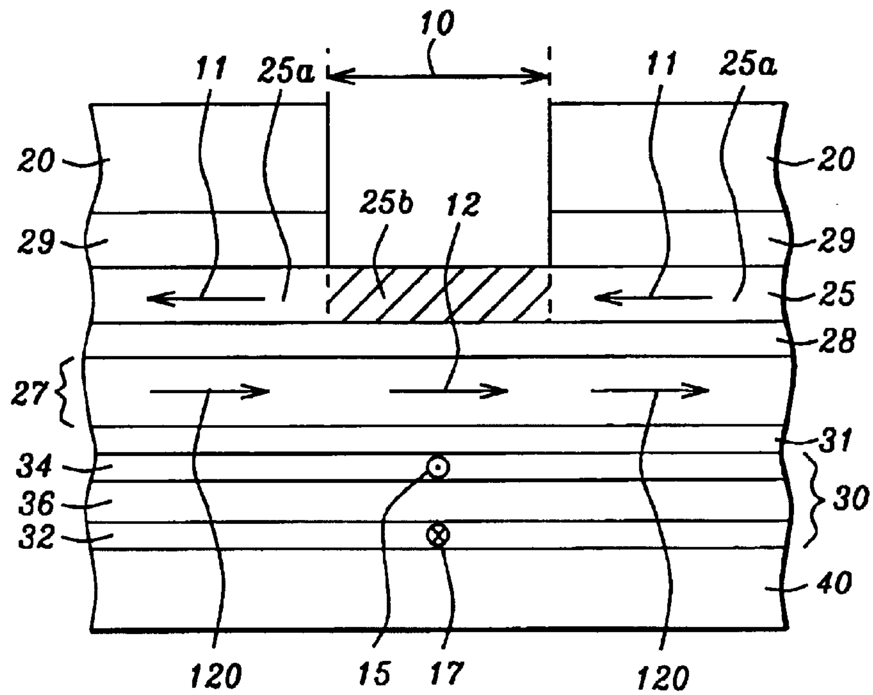
FIG. 1a – Prior Art
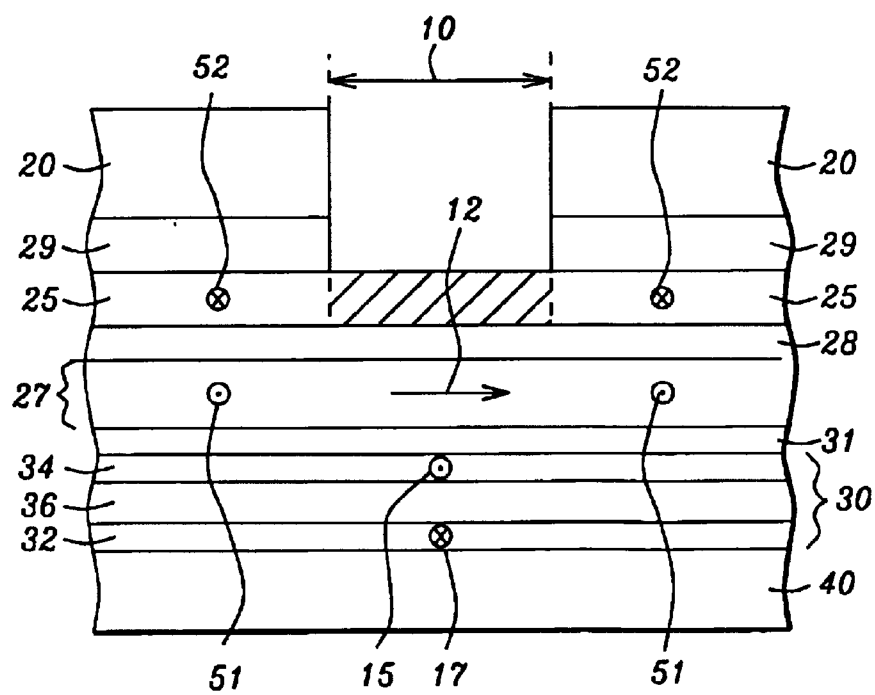
FIG. 1b – Prior Art

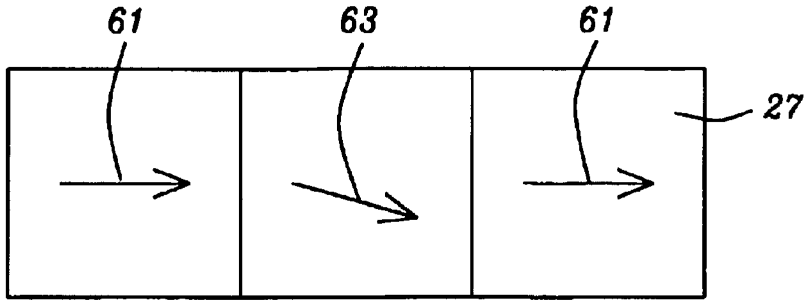
FIG. 2a - Prior Art
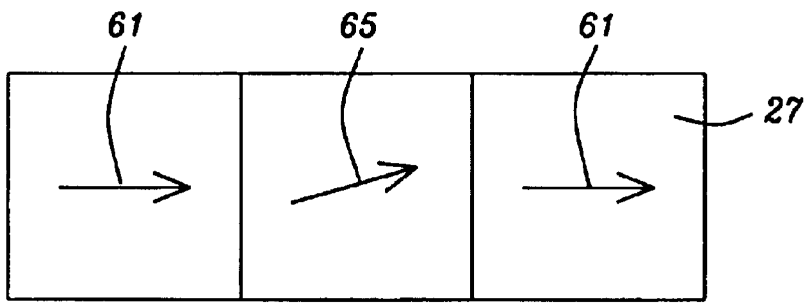
FIG. 2b - Prior Art
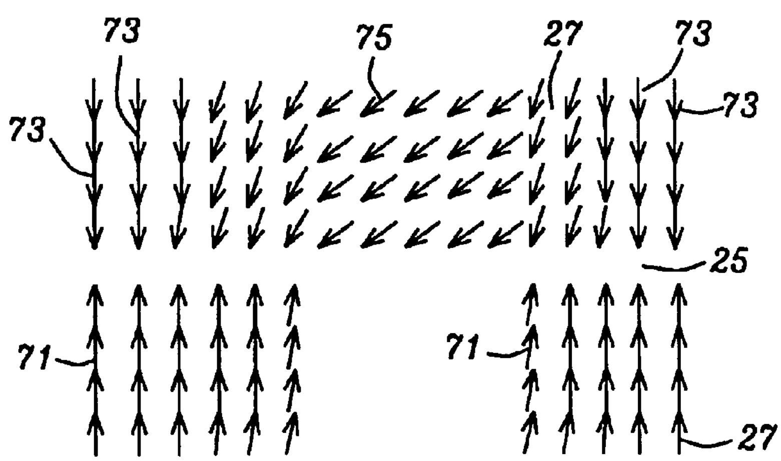
FIG. 3a - Prior Art

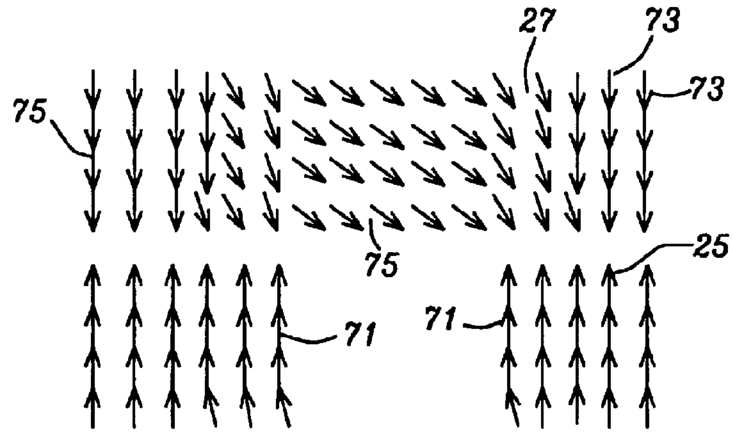
FIG. 3b – Prior Art
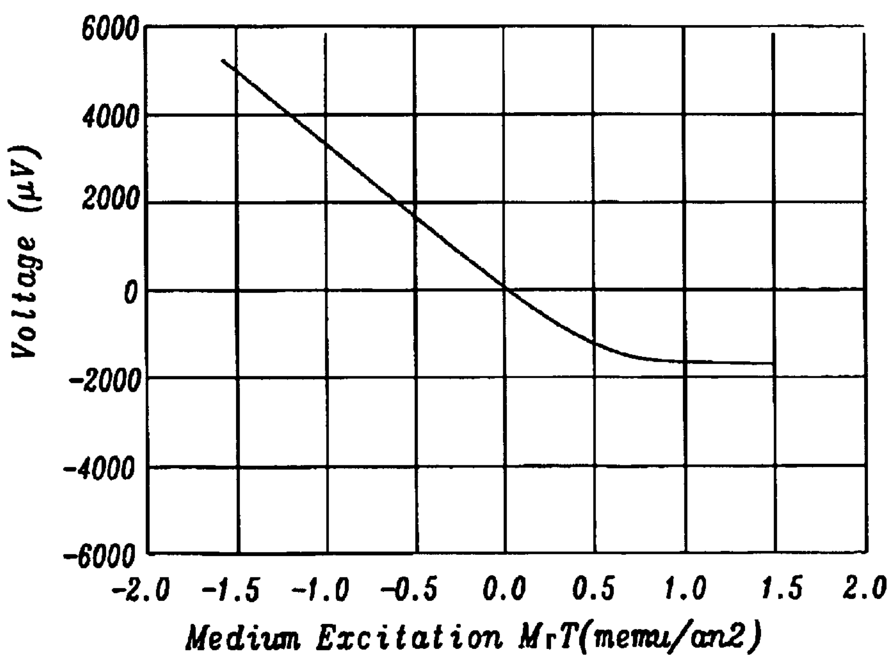
FIG. 3c – Prior Art

DESIGN OF CANTED SYNTHETIC PATTERN EXCHANGE SPIN VALVE HEAD FOR IMPROVING STABILITY AND BIAS

RELATED PATENT APPLICATION

This application is related to Ser. No. (10/091,959), filing date (Mar. 6, 2002), to Ser. No. (10/104,802), filing date (Mar. 6, 2002), and to Ser. No. (10/077,064), filing date (Feb. 15, 2002), all assigned to the same assignee as the current invention.

BACKGROUND OF THE INVENTION

1. Field of the Invention

This invention relates generally to the fabrication of a giant magnetoresistive (GMR) magnetic field sensor for a magnetic read head, more specifically to the use of canted synthetic exchange biasing to produce a sensor with increased dynamic range, increased stability and improved control of its bias point.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer called the pinning layer. The free layer is magnetized in a direction along the width of the sensor and parallel to the air bearing surface (the longitudinal direction). The prior art also teaches dual sensors, such as is taught by Gill et al. (U.S. Pat. No. 5,701,222) wherein two identical sensor structures are formed, one on top of the other, differing only in that the magnetizations of their fixed layers are antiparallel.

Layers of hard magnetic material (permanent magnetic layers) or laminates of antiferromagnetic and soft magnetic materials are typically formed on each side of a sensor and oriented so that their magnetic field extends in the same direction as that of the free layer. These layers, called longitudinal bias layers, maintain the free layer as a single magnetic domain and also assist in linearizing the sensor response by keeping the free layer magnetization direction normal to that of the fixed layer when the sensor is quiescent (not reading data). Maintaining the free layer in a single domain state significantly reduces noise (Barkhausen noise) in the signal produced by thermodynamic variations in domain configurations.

The importance of effective longitudinal bias has led to various inventions designed to improve the material composition, structure, positioning and method of forming the magnetic layers that produce it. One form of the prior art provides for sensor structures in which the longitudinal bias layers are layers of hard magnetic material (permanent magnets) that abut the etched back ends of the active region of the sensor to produce what is called an abutted junction configuration. This arrangement fixes the domain structure of the free magnetic layer by magnetostatic coupling through direct edge-to-edge contact at the etched junction between the biasing layer and the exposed end of the layer being biased (the free layer). Another form of the prior art, patterned exchange bias, appears in two versions: 1) direct exchange and 2) synthetic exchange. Unlike the magnetostatic coupling resulting from direct contact with a hard magnetic material that is used in the abutted junction, in exchange coupling the free layer is extended laterally beyond the trackwidth region. This outer extended region is called the "wing region." The magnetization in the wing region is fixed by a biasing layer which overlays the wing region of the free layer. This biasing layer is either a single layer of antiferromagnetic material, in the direct exchange scheme, or a synthetic antiferromagnetic layer in the synthetic exchange scheme. In direct exchange coupling, an antiferromagnetic material such as IrMn, PtMn, or NiMn is directly overlaid on the free layer in the wing region in a simple scheme, but one with weak pinning strength. In synthetic exchange coupling, a synthetic antiferromagnetic biasing layer is formed by separating two ferromagnetic layers by a non-magnetic coupling layer (eg. Cu, Ru or Rh) whose thickness is chosen to allow antiferromagnetic coupling, wherein the magnetization of the biasing and biased layers are antiparallel. Xiao et al. (U.S. Pat. No. 6,322,640 B1) disclose a method for forming a double, antiferromagnetically biased GMR sensor, using as the biasing material a magnetic material having two crystalline phases, one of which couples antiferromagnetically and the other of which does not. Liao et al. (U.S. Pat. No. 6,308,400 B1) teach a method of achieving anti-parallel exchange coupling by the use of a biased layer with low coercivity. The use of novel forms of direct and synthetic exchange coupling in providing longitudinal biasing of a sensor is taught in related Patent Applications HT-01-037, and HT-01-032 assigned to the same assignee as the present invention and which is fully incorporated herein by reference. HT-01-032 teaches direct exchange coupling using an antiferromagnetic layer as the biasing layer. Related application HT-01-037, also assigned to the same assignee as the present invention, teaches synthetic exchange coupling using antiferromagnetic exchange coupling between the biasing layer and the free layer. The use of synthetic exchange coupling in providing both longitudinal and transverse biasing ("transverse" meaning pinning the free layer transversely at its lateral edges, but maintaining its longitudinal magnetization in the sensor trackwidth region) of a sensor is taught in related Patent Application HT-01-036/038 assigned to the same assignee as the present invention and which is fully incorporated herein by reference.

The discussion above has centered on various methods of providing longitudinal and transverse biasing of a free layer. Along with the choice of method, the practitioner skilled in the art has the additional freedom of biasing the free magnetic layer so that its magnetization is in a direction other than perpendicular to or transverse to the plane of the air bearing surface of the sensor. Indeed, the prior art teaches canted biasing in the context of direct exchange biasing, wherein magnetic layers are biased at various angles to the air bearing surface in order to improve sensor performance. Li et al. (U.S. Pat. No. 6,295,718 B1) teaches a method of fabricating a sensor having multiple magnetic layers that are exchange biased in non-parallel directions, while still using a single biasing material, but employing a series of magnetic annealing steps. The method discloses an enhanced bias profile that is provided by the non-parallel biasing directions. In a somewhat similar vein, Guo et al. (U.S. Pat. No. 6,230,390 B1) teaches a method of forming a dual stripe sensor (one sensor element formed over another) in which the free layers of each sensor are directly exchange biased in directions canted relative to the air bearing surface and relative to each other.

As the area density of magnetization in magnetic recording media (eg. magnetic disks) continues to increase (eg. above 30 gigabytes/in$^2$), significant reduction in the width of the active sensing region (trackwidth) of read-sensors becomes necessary. For trackwidths less than 0.2 microns ($\mu$m), the traditional abutted junction hard bias structure discussed above becomes unsuitable because the strong magnetostatic coupling at the junction surface actually pins the magnetization of the (very narrow) biased layer (the free layer), making it less responsive to the signal being read and, thereby, significantly reducing the sensor sensitivity. Under such very narrow trackwidth conditions, the exchange bias method becomes increasingly attractive, since the free layer is not reduced in size by the formation of an abutted junction, but extends continuously across the entire width of the sensor element.

The direct exchange biasing also has its shortcomings when used in a very narrow trackwidth configuration because of the weakness of the pinning field. For example, the pinning field provided to the free and biasing layers by the antiferromagnetic layer in HT-01-032 cited above is found to be, typically, approximately 250 Oe. A stronger pinning field, typically exceeding 700 Oe, can be obtained using the synthetic exchange biasing method. As noted above, related Patent Applications HT-01-037 and HT-01-036/38 both teach methods of forming synthetic exchange (longitudinally or transversely) biased sensors in which the sensor's free layer is strongly pinned by the exchange biasing layers, yet in which a narrow trackwidth can be formed. It is the purpose of the present invention to teach a method of canting the biasing magnetizations within the context of the synthetic exchange biasing taught in the related Patent Applications above and to thereby further improve the performance of the sensor by eliminating instability and improving the bias point.

SUMMARY OF THE INVENTION

Accordingly, it is a first object of this invention is to provide a method of canting the free layer magnetization of a sensor while providing the pinning strength and narrow trackwidths of synthetic exchange biasing.

It is a second object of the present invention to provide a method of canting the free layer magnetization of a sensor which is either longitudinally or transversely synthetically exchange biased.

It is a third object of the present invention to provide longitudinally and transversely synthetically exchange biased sensor in which bi-stable domain states are eliminated by the canting of the bias layer pinning field and in which the bias level is improved.

It is a fourth object of the present invention to provide such a sensor in which instabilities due to domain shifting during playback are eliminated.

It is a fifth object of the present invention to provide such a sensor with a wider dynamic range.

The objects of the present invention are achieved by the application of synthetic exchange biasing in which the lateral edges of the sensor's free layer are substantially either longitudinally or transversely pinned, yet wherein the pinning field is canted to a certain degree. Further, it is proposed within the present invention to reverse the direction of the biasing current to further optimize the bias level.

FIGS. 1*a* and 1*b*, respectively, are schematic cross-sectional depictions across the air-bearing surface plane, of longitudinal (1*a*) and transverse (1*b*) synthetic exchange biased sensors in accord with the prior art of HT-01-036/36. Looking first at prior art FIG. 1*a*, there is seen a spin-valve configured sensor in which there is a synthetic antiferromagnetic pinned layer (30), magnetized in an antiparallel couple, transversely to the air bearing surface as indicated by arrows (15) and (17), pointing respectively out of and into the plane. The pinned layer (30) comprises two antiferromagnetically exchange coupled ferromagnetic layers (32) and (34), coupled by a coupling layer (36) and pinned by an antiferromagnetic pinning layer (40). The free layer (27) is magnetized longitudinally as indicated by the arrow (12), drawn approximately in the trackwidth region of the sensor. The magnetization of the free layer is pinned, and thereby biased, at its lateral edges (arrows (120)) by the patterned ferromagnetic biasing layer (25), whose magnetization is antiparallel to that of the free layer as shown by arrows (11). The biasing layer (25) is antiferromagnetically coupled (across the coupling layer (28)) to layer (27) at its edges (25*a*) and is pinned there by the patterned antiferromagnetic layer (29). The central portion of the biasing layer (25*b*) has been oxidized to eliminate its magnetic properties. There are thus two synthetic antiferromagnetic structures in this design, the pinned layer (30) and the biasing structure of the free layer. Prior art FIG. 1*b* shows an identical physical structure to that depicted in FIG. 1*a*, except that the free layer is pinned at its lateral edges by transversely directed magnetizations of the patterned biasing layer (25). The free layer (27) is still magnetized longitudinally in the trackwidth region as shown by arrow (12), but its magnetization at its lateral edges, as shown by arrows (51), is transverse and antiparallel to the magnetization of the patterned biasing layer (25), which is shown by arrows (52).

The longitudinal biasing schemes discussed above present problems with the stability of the free layer magnetizations. FIGS. 2*a* and 2*b* are schematic depictions of two magnetization (domain) states of the free layer (27) in FIG. 1*a*, shown in an overhead view. In both states the pinned edges are substantially magnetized longitudinally forming edge domains as shown by arrows (61), but the central trackwidth magnetization, as shown by arrow (63) in 2*a* and (65) in 2*b*, can be canted slightly towards or away from the air bearing surface, with substantially equal likelihood. During sensor operation, the magnetization may shift unpredictably, causing instability of the sensor output. From the fabrication point of view, it is noted that the longitudinal biasing scheme corresponding to FIG. 1*a* and FIG. 2 requires pinning of the bias layer (25) and the pinning layer (30) in mutually perpendicular directions, which necessitates the use of antiferromagnetic pinning layers of different blocking temperatures.

For the transverse biasing scheme of FIG. 1*b*, the lateral edge pinning of the biasing layer (25) forms edge domains with transverse magnetization in the free layer (27). Referring to FIG. 3*a*, there is shown overhead views of the magnetizations of the free (27) and biasing layers (25) as indicated by arrows (71) in the biasing layer and arrows (73) and (75) in the free layer. This figure represents one of the stable domain states accessible to the sensor. The edge domain of the free layer has arrows (73) which are substantially antiparallel to those (71) of the biasing layer. The central region of the free layer, however, shows a magnetization (75) of variable direction. This variation of magnetization in the central trackwidth region results from grain-to-grain exchange coupling between the edge domain magnetization (73) and the central trackwidth region magnetization (75). For a sensor with an active region of approximately 0.1×0.08 $\mu m^2$, the average biased angle is calculated to be approximately 34°. Referring to FIG. 3*b*, there is shown the second accessible domain state of the sensor of FIG. 3*a*. All physical parameters for the two states are identical. The existence of dual domain states is due to the lack of a longitudinal biasing force. Referring to FIG. 3*c* there is shown a transfer curve for a transversely synthetic exchange biased scheme. This curve measures the voltage change of the sensor under a certain range of transverse field supplied by the medium, with MrT (abscissa) being the medium's magnetic moment.

For reference purposes, the domain states of FIGS. 3*a* and 3*b* and the transfer curve of 3*c* were calculated for the configuration of FIG. 1*b* wherein the sensor layers were formed of the following materials and dimensions:

| | |
|---|---|
| Pinning layer (40): | MnPt, 100 angstroms |
| Ferromagnetic pinned layer (32): | CoFe, 13 angstroms |
| Coupling layer (36): | Ru, 7.5 angstroms |
| Ferromagnetic pinned layer (34): | CoFe, 15 angstroms |
| Spacer layer (31): | Cu, 18 angstroms |
| Free layer (27): | a bi-layer comprising CoFe, 10 angstroms and NiFe, 20 angstroms |
| Coupling layer (28): | Ru, 7.5 angstroms |
| Biasing layer (25): | CoFe, 15 angstroms |
| Pinning layer (29): | IrMn, 40 angstroms. |

The asymmetry of the transfer curve in FIG. 3*c* indicates that the bias point (quiescent state magnetization) is far away from the center point (true longitudinal magnetization), which is due to the large initial bias angle in the free layer.

Conventionally, the bias current is set so that the current induced magnetic field in the free layer (27) is opposite to the demagnetization field of the antiferromagnetic pinned layer (30), which turns out to be in the same direction as the grain-grain exchange field between the edge and center domains of the free layer. The vector sum of the current induced magnetic field and the grain-grain exchange field is much larger than the antiferromagnetic demagnetization field (the field from the net magnetic moment of the pinned layer (30)), which results in the unbalanced bias level. It is the large resulting bias angle which leads to the large bias point deviation and small dynamic range during playback.

Within the context of the invention and the achievement of its objects, along with the canting of the biasing fields, it is also proposed to reverse the conventional direction of the bias current for further improvement of sensor performance.

BRIEF DESCRIPTION OF THE DRAWINGS

FIGS. 1*a* and 1*b* are schematic depictions of longitudinally and transversely synthetic exchange biased sensors of the prior art.

FIGS. 2*a* and 2*b* are schematic depictions of two domain states of a longitudinally exchange biased prior art sensor (eg. FIG. 1*a*).

FIGS. 3*a* and 3*b* are schematic depictions of two domain states of a transversely synthetic exchange biased prior art sensor (eg. FIG. 1*b*).

FIG. 3*c* is a calculated graph of the transfer curve for a transversely synthetic exchange biased scheme.

DESCRIPTION OF THE PREFERRED EMBODIMENTS

Figure 4A:
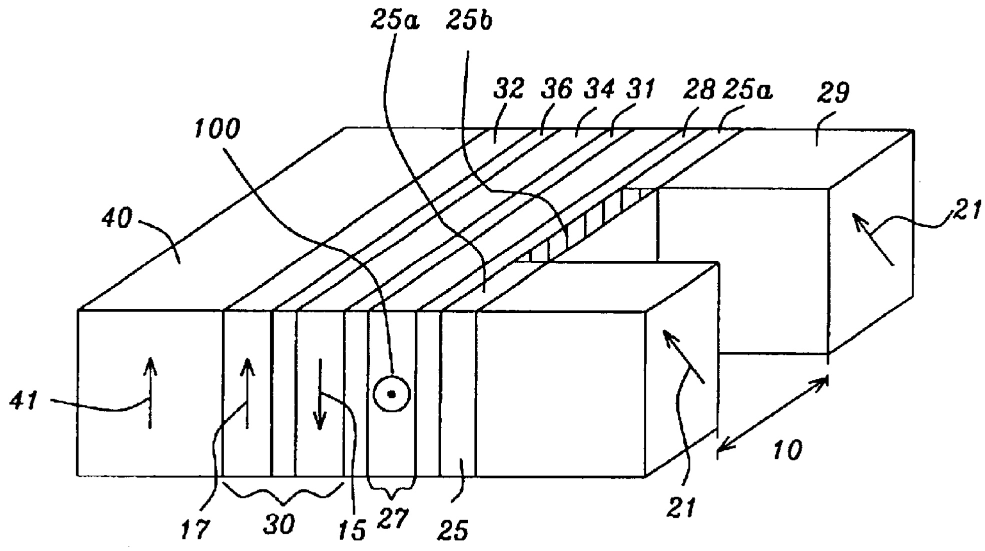
FIG. 4*a* is a schematic 3-dimensional view of the canted exchange biased sensor of the present invention.

The preferred embodiments of the present invention teach a method of forming a synthetic exchange biased sensor of the spin-valve type in which the biasing magnetization is canted with respect to the longitudinal and transverse directions relative to the air bearing surface plane of the sensor. Referring to FIG. 4*a*, there is seen a schematic 3-dimensional view of a spin-valve exchange biased sensor in which the biasing magnetization has been canted, by either of two processes to be described below, in accordance with the objects of the invention.

First Preferred Embodiment

Antiferromagnetic pinning layer (40), which is a layer of MnPt of thickness between approximately 80 and 150 angstroms, but preferably approximately 100 angstroms, has a transversely directed magnetization vector (arrow (41)) as shown. Synthetic antiferromagnetic pinned layer (30) is a tri-layer comprising second ferromagnetic layer (32), coupling layer (36) and first ferromagnetic layer (34). Ferromagnetic layer (32) is preferably a layer of CoFe formed to a thickness between approximately 10 and 30 angstroms, with approximately 13 angstroms being preferred. Coupling layer (36) is preferably a layer of Ru formed to a thickness between approximately 5 and 10 angstroms, with approximately 7.5 angstroms being preferred. Ferromagnetic layer (34) is preferably a layer of CoFe formed to a thickness between approximately 10 and 30 angstroms with approximately 15 angstroms being preferred. The magnetizations, to be produced by a subsequent annealing process, are shown as arrows (17) and (15). A spacer layer of non-magnetic, conducting material (31) is formed on the pinned layer, the spacer layer being preferably a layer of Cu formed to a thickness between approximately 15 and 30 angstroms, with approximately 18 angstroms being preferred. A ferromagnetic free layer (27) is formed on the spacer layer, the free layer being preferably a bi-layer comprising a layer of CoFe (24) on which is formed a layer of NiFe (26). The CoFe layer is formed to a thickness between approximately 0 and 20 angstroms, with approximately 10 angstroms being preferred, whereas the NiFe layer is formed to a thickness between approximately 0 and 50 angstroms, with approximately 20 angstroms being preferred. As can be seen in FIG. 4*a*, the formation of layers differs in the central trackwidth region (arrow (10)) and the laterally disposed biasing region (arrow (9)). Related application HT-01-036/038 teaches the method by which the trackwidth region is formed from an initial layer formation that is uniform across the entire width of the sensor and is then etched and oxidized to form the trackwidth region. The description herein will, therefore, be limited to describing the final layer sequence in the two regions, rather than the process of forming the trackwidth region. Referring again to FIG. 4*a*, the biasing region (9) laterally disposed about the trackwidth region further comprises a coupling layer (28), which extends the full width of the sensor and provides the antiferromagnetic exchange coupling between the patterned biasing layer (25) and the free layer (27). The coupling layer is preferably a layer of Ru formed to a thickness between approximately 5 and 10 angstroms, with approximately 7.5 angstroms being preferred. Over the coupling layer is formed the patterned ferromagnetic biasing layer (25), which is preferably a layer of CoFe formed to a thickness that is slightly thicker than the free layer, with approximately 25 angstroms being preferred. As is noted in HT-01-036/038 the biasing layer is patterned magnetically rather than physically, in that a central portion **(25*b*) is oxidized to eliminate its magnetic properties, leaving disjoint, laterally disposed portions (25*a*) which are not oxidized and, therefore, retain their magnetic properties. A patterned antiferromagnetic pinning layer (29) is formed on the biasing layer, the pinning layer being preferably a layer of IrMn formed to a thickness between approximately 40 and 100 angstroms, with approximately 40 angstroms being preferred. A patterned conducting lead layer (not shown), being preferably a Ta/Au/Ta tri-layer is formed on the pinning layer. The central trackwidth region lacks the antiferromagnetic pinning layer and the conducting lead layer and the biasing layer (25) has not been physically removed, but has been oxidized to form a non-magnetic layer of CoFeO (25*b*) in that region. The biasing current is shown as arrow (100)**.

Annealing can be done in two steps. First, a 10 kOe (kilo-Oersted) field is directed transversely into the plane of the air bearing surface (ABS) while the sensor is at a temperature of approximately 280° C., for a period of approximately 5 hours. This anneal produces the magnetization of the antiferromagnetic pinning (40) and synthetic antiferromagnetic pinned layers (30) as indicated by arrows (41), (15) and (17). A second anneal, using a magnetic field of approximately 600 Oe directed out of the ABS, at an angle of between approximately 45–75 degrees to it, at a temperature of approximately 250° C., for approximately 10–30 minutes. This anneal will cant the magnetization of the biasing layers as indicated by the arrows (21), to achieve the objects of the invention.

Second Preferred Embodiment

In a second preferred embodiment, the sensor is formed and annealed exactly as in the first preferred embodiment, with the following exception: coupling layers (36) and (28) are layers of Rh formed to a thickness between approximately 3 and 7 angstroms, with approximately 5 angstroms being preferred.

It is further noted that the objects of the present invention can also be attained in either preferred embodiment by the substitution of antiferromagnetic pinning layers (40) and (29) formed of NiMn, PtMn, PdPtMn, FeMn and IrMn in various combinations.

In Either the First or Second Preferred Embodiments

Figure 4B:
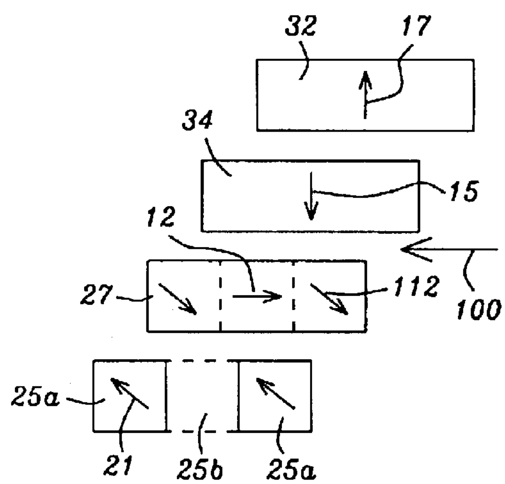
FIG. 4*b* is an exploded overhead schematic of the magnetizations of the pinned and free layers of the sensor in 5*a* with one current direction.
Figure 4C:
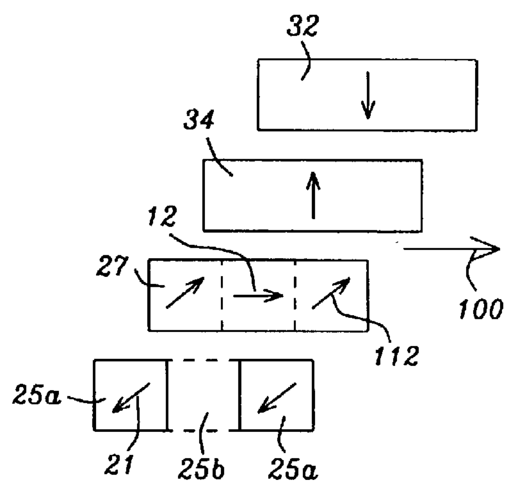
FIG. 4*c* is an exploded overhead schematic of the magnetizations of the pinned and free layers of the sensor in 5*a* with an opposite current direction.

With regard to either the first or second preferred embodiments, it is noted that the direction of the bias current can be changed to optimize the bias point. Referring now to FIGS. **4*b* and 4*c* there are shown exploded schematic views of the first and second ferromagnetic layers (32) and (34) of the synthetic pinned layer and the free layer (27) and its patterned biasing layer (25), showing the magnetization directions as indicated by arrows (15), (17), (12), (112) and (21). The pinning field of the bias layer (21) is canted approximately 45° away from the transverse direction. Arrow (17) in FIG. 4*b* points away from the ABS, while in FIG. 4*c* it points towards the ABS. In both figures, the bias current direction is indicated by arrow (100). In FIG. 4*b* the current direction is opposite to the conventional direction, which is set so that the current induced field in the free layer is opposite to the direction of the pinning fields in its edge domains (112). In FIG. 4*c***, the bias current is in the conventional direction, and its affect on the pinning fields is shown by the corresponding arrows. The essential point is that the current direction is an additional parameter that can be changed to adjust the bias point and to achieve the objects of the present invention.

Figure 5:
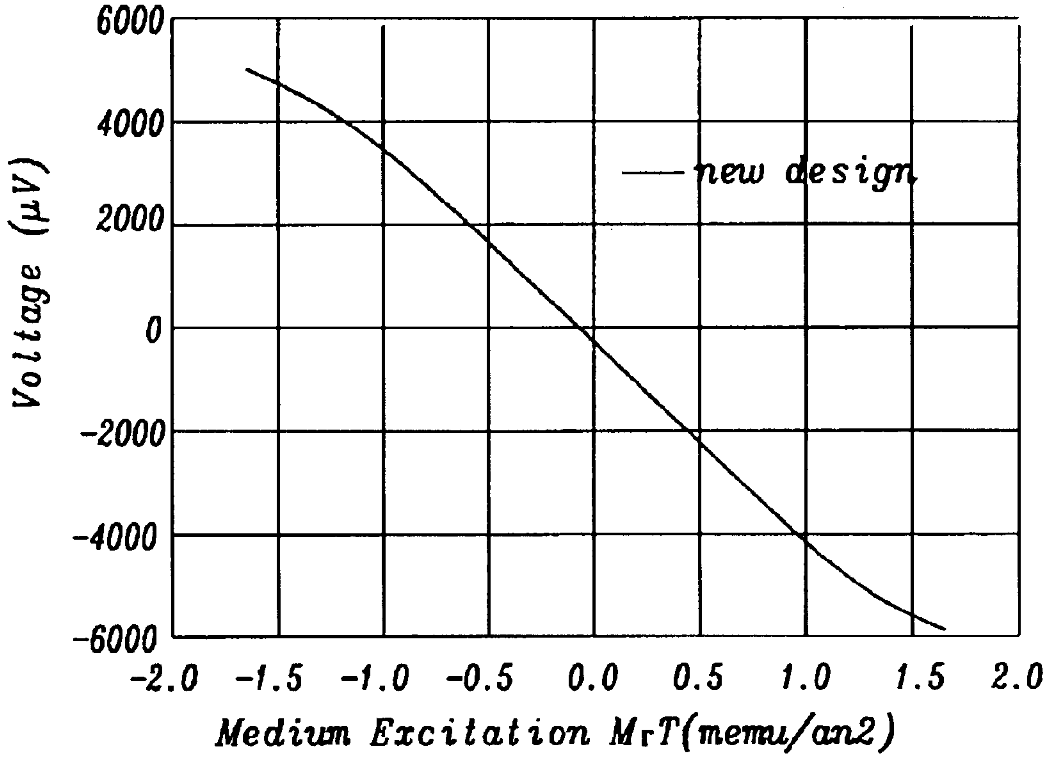
FIG. 5 is a graphical representation of the transfer curve for the sensor formed in accord with the present invention.

Referring finally to FIG. 5, there is shown a calculated transfer curve for the sensor of FIG. **4*a*. Also included (in dashed lines) is the transfer curve of FIG. 3*c*** for a prior art sensor. As can be seen, the canted bias has rendered the transfer curve more symmetric and has extended it into regions of greater negative voltage, implying a wider dynamic range for the sensor in accord with the objects of the invention.

As is understood by a person skilled in the art, the preferred embodiments of the present invention are illustrative of the present invention rather than limiting of the present invention. Revisions and modifications may be made to methods, materials, structures and dimensions employed in fabricating a GMR sensor having a synthetically exchange biased free layer with a canted field, while still providing such a GMR sensor having a synthetically exchange biased free layer with a canted field as described herein, in accord with the spirit and scope of the present invention as defined by the appended claims.

What is claimed is:

1. A method of forming a GMR sensor having a synthetically exchange biased free layer with a canted biasing field comprising:

providing a GMR sensor element having a spin-valve structure including a synthetic antiferromagnetic pinned layer and an uppermost layer which is a ferromagnetic free layer;

forming on the ferromagnetic free layer of said sensor element an antiferromagnetically coupling layer;

forming on said coupling layer a patterned ferromagnetic biasing layer, said layer being a single material layer having disjoint, laterally disposed ferromagnetic regions separated by a non-magnetic oxidized region;

forming on said material layer and contiguous with said laterally disposed ferromagnetic regions, a patterned antiferromagnetic pinning layer;

forming on said pinning layer and contiguous with it, a patterned conducting lead layer, said lead layer enabling the introduction of a biasing current in either of two directions and completing, thereby, said GMR sensor;

annealing said GMR sensor in a first annealing field, which is directed transversely to an air bearing surface plane of said sensor, at a first annealing temperature for a first annealing time, to set the magnetizations of said synthetic antiferromagnetic pinned layer; and then annealing said GMR sensor in a second annealing field, which is canted with respect to said first annealing field, at a second annealing temperature for a second annealing time, to synthetically exchange couple said biasing layer to said free layer with a canted biasing field.

2. The method of claim 1 wherein said antiferromagnetically coupling layer is a layer of Ru formed to a thickness between approximately 5 and 10 angstroms.

3. The method of claim 1 wherein the antiferromagnetically coupling layer is a layer of Rh formed to a thickness between approximately 3 and 7 angstroms.

4. The method of claim 2 or 3 wherein the first annealing field is between approximately 8 and 15 kOe.

5. The method of claim 4 wherein the first annealing temperature is between approximately 270 and 290° C.

6. The method of claim 5 wherein the first annealing time is between approximately 5 and 6 hours.

7. The method of claim 6 wherein the second annealing field is between approximately 550 and 700 Oe and it is canted between approximately 45 and 70 degrees to the plane of the said air bearing surface.

8. The method of claim 7 wherein said second annealing temperature is between approximately 240 and 260° C.

9. The method of claim 8 wherein said second annealing time is between approximately 10 and 30 minutes.

10. The method of claim 9 wherein said canted biasing field can be varied by changing the direction of said biasing current.

11. A GMR sensor having synthetically exchange biased free layer with a canted biasing field comprising:

a GMR sensor element having a spin-valve structure including a synthetic antiferromagnetic pinned layer and an uppermost layer which is a ferromagnetic free layer;

an antiferromagnetically coupling layer formed on the ferromagnetic free layer of said sensor element;

a patterned ferromagnetic biasing layer, said layer being a single material layer having disjoint, laterally disposed ferromagnetic regions separated by a non-magnetic oxidized region, formed on said coupling layer;

a patterned antiferromagnetic pinning layer formed on said material layer and contiguous with said laterally disposed ferromagnetic regions;

a patterned conducting lead layer formed on said pinning layer and contiguous with it, said lead layer enabling the introduction of a biasing current in either of two directions; and the magnetizations of said synthetic antiferromagnetic pinned layer being set in a direction transverse to the air bearing surface plane of said GMR sensor; and the biasing field of said biasing layer being set in a direction canted relative to said air bearing surface plane.

12. The sensor of claim 11 wherein said antiferromagnetically coupling layer is a layer of Ru formed to a thickness between approximately 5 and 10 angstroms.

13. The sensor of claim 11 wherein the antiferromagnetically coupling layer is a layer of Rh formed to a thickness between approximately 3 and 7 angstroms.

14. The sensor of claim 12 or 13 wherein biasing field is canted at an angle of between approximately 45 and 70 degrees.

15. The sensor of claim 14 wherein the biasing field direction can be varied by changing the direction of said biasing current.

* * * * *